(12) United States Patent
Warnakulasuriya

(10) Patent No.: US 10,756,160 B2
(45) Date of Patent: Aug. 25, 2020

(54) INSULATING MAGNETIC COMPONENTS ON SILICON USING PNP OR NPN JUNCTIONS

(71) Applicant: Murata Manufacturing Co., Ltd., Nagaokakyo-shi, Kyoto-fu (JP)

(72) Inventor: Kapila Warnakulasuriya, Milton Keynes (GB)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/993,966

(22) Filed: May 31, 2018

(65) Prior Publication Data

US 2018/0350894 A1    Dec. 6, 2018

Related U.S. Application Data

(60) Provisional application No. 62/513,555, filed on Jun. 1, 2017.

(51) Int. Cl.
| | | |
|---|---|---|
| *H01L 49/02* | (2006.01) | |
| *H01L 21/761* | (2006.01) | |
| *H01L 29/06* | (2006.01) | |
| *H01L 23/64* | (2006.01) | |

(52) U.S. Cl.
CPC ............ *H01L 28/10* (2013.01); *H01L 21/761* (2013.01); *H01L 29/0646* (2013.01); *H01L 23/645* (2013.01); *H01L 2924/3011* (2013.01)

(58) Field of Classification Search
CPC ... H01L 28/10; H01L 21/761; H01L 29/0646; H01L 23/645; H01L 2924/3011
See application file for complete search history.

(56) References Cited

U.S. PATENT DOCUMENTS

| | | | |
|---|---|---|---|
| 3,909,700 A | * | 9/1975 | Ferro .................. H01L 27/0664 363/147 |
| 2010/0078761 A1 | | 4/2010 | Hui |
| 2011/0095364 A1 | * | 4/2011 | Stecher ............... H01L 23/4824 257/337 |
| 2011/0279214 A1 | * | 11/2011 | Lee ......................... H01F 17/08 336/220 |
| 2012/0262265 A1 | * | 10/2012 | Lo ......................... H01F 27/022 336/83 |
| 2014/0062641 A1 | | 3/2014 | Chen et al. |
| 2014/0167218 A1 | * | 6/2014 | Mallikarjunaswamy .................... H01L 27/0248 257/531 |

* cited by examiner

*Primary Examiner* — Patricia D Reddington
(74) *Attorney, Agent, or Firm* — Keating & Bennett, LLP

(57) ABSTRACT

A magnetic component includes a semiconductor substrate, a first winding that is located in the semiconductor substrate and that includes at least two turns, and intra-winding insulation located between two adjacent turns of the at least two turns and including doped regions in the semiconductor substrate that define either an NPN-junction or a PNP junction.

13 Claims, 3 Drawing Sheets

INSULATING MAGNETIC COMPONENTS ON SILICON USING PNP OR NPN JUNCTIONS

BACKGROUND OF THE INVENTION

1. Field of the Invention

The present invention relates to using PNP or NPN (PNP/NPN) junctions to provide insulation of magnetic components, including magnetic components formed on silicon such as micro-transformers, micro-inductors, and other compact magnetics such as PCB-integrated magnetic components.

2. Description of the Related Art

There is an increasing demand for smaller and smaller magnetic components. Typically, as the operating frequencies increase, the magnetic components get smaller, but this is not always true or it does not happen in proportion to the increase in frequency. One of the reasons for not being able to miniaturize magnetic components in proportion to the increase in operating frequencies is the difficulty of maintaining the dielectric strength between the turns of a single winding (inter-turn dielectric strength) and between the primary and secondary windings (inter-winding dielectric strength). It is also challenging to maintain the minimum creepage and clearance distances in miniaturized constructions.

In somewhat larger PCB-integrated magnetic components, fiber-reinforced plastic (FRP) or similar insulating material is conventionally used for physical separation.

Recently, to achieve highly compact electronics devices, magnetic components have been formed in silicon. As the magnetic components become more compact, it becomes more challenging to meet the isolation requirement between separate windings and between turns of a single winding, which limits how compact magnetic components can be. This is a considerable constraint in achieving highly compact magnetic components, especially in the case of low-power applications, such as magnetic components formed in silicon. In magnetics-on-silicon applications, it is known to use un-doped silicon or silicon oxide as an insulator between current conductors that require isolation. A conventional approach of maintaining physical separation on a complementary metal-oxide-semiconductor (CMOS) wafer or monolithic solution power supply on chip (PwrSoC) is used in micro-transformers and micro-inductors.

For example, the allowable leakage current in medical-grade magnetic components is in the range of a few tens of μA. However, the reverse saturation current of commercially produced PN junctions is in the range of a few tens of nA for a reversed biased voltage in the range of about 100 V. Therefore, even with conventional semiconductor-manufacturing technologies, PN junction fabrication with magnetic components on silicon and magnetic components fabricated on a PN junction would benefit from being able to meet improved dielectric strength, creepage distance, and clearance distance requirements.

It is known to use a highly doped path of a semiconductor as the conductor (e.g., as the winding of a magnetic component), instead of using a conductive material. An oxidized semiconductor layer is used as insulation between such conductors. But the oxidized semiconductor layer does not provide adequate dielectric strength, which can result in inadequate isolation properties.

SUMMARY OF THE INVENTION

To overcome the problems described above, preferred embodiments of the present invention provide insulation using NP or PN (NP/PN) junctions between portions of a single current conductor (intra-winding insulation) and/or between separate current conductors (inter-winding insulation) that require isolation. The NP/PN junctions provide a much higher dielectric strength and isolation properties than oxidized silicon or other insulating material. Preferred embodiments of the present invention provide a reversed biased PN junction over an entire voltage cycle between the portions of the magnetic component needing isolation.

Preferred embodiments of the present invention provide isolation with reversed biased PN junctions, making it possible to bring the current conductors much closer to each other, while maintaining the dielectric strength in a more reliable way. The level of leakage current that can be achieved is considerably lower than regulatory requirements.

Because the reversed biased PN junction acts as an insulator, the minimum creepage distance is a distance through insulation (DTI), making obtaining safety approval and compliance with International Electrotechnical Commission (IEC) and Underwriters Laboratories (UL) standards easier. Depending on the type of product, regulatory standards, such as IEC and UL standards, specify certain minimum distances between two current conductors, including minimum creepage distances along the surface and minimum clearance distances through air. However, if the product uses insulation, then these minimum distances become a fraction of their non-insulation distances. By using PN junctions between current conductors, the preferred embodiments of the present invention improve compactness because the current conductors can be located closer together. Because of the properties of PN junctions, the thickness of the insulation can be a few microns as discussed below.

According to a preferred embodiment of the present invention, a magnetic component includes a semiconductor substrate, a first winding that is located in the semiconductor substrate and that includes at least two turns, and intra-winding insulation located between two adjacent turns of the at least two turns and including doped regions in the semiconductor substrate that define either an NPN-junction or a PNP junction.

The first winding preferably includes a doped region in the semiconductor substrate that is doped more than the doped regions included in the intra-winding insulation. The first winding preferably includes a conductive material. Preferably, the magnetic component further includes a magnetic core, and the first winding winds around the magnetic core.

According to a preferred embodiment of the present invention, an integrated package includes the magnetic component of various preferred embodiments of the present invention.

The integrated package further preferably includes an on-chip power supply.

According to a preferred embodiment of the present invention, a magnetic component includes a semiconductor substrate, first and second conductors that are located in the semiconductor substrate, and inter-conductor insulation located between the first and second conductors and including doped regions in the semiconductor substrate that define either an NPN-junction or a PNP junction.

Preferably, the first conductor is a winding that includes at least two turns, and intra-winding insulation is located between two adjacent turns of the at least two turns and includes doped regions in the semiconductor substrate that define either an NPN-junction or a PNP junction. Each of the first and second conductors preferably includes a doped region in the semiconductor substrate that is doped more than the doped regions included in the inter-conductor insulation. Each of the first and second conductors preferably includes a conductive material. Preferably, the magnetic component further includes a magnetic core, and the first and second conductors wind around the magnetic core to define a transformer.

According to a preferred embodiment of the present invention, an integrated package includes the magnetic component according to various preferred embodiments of the present invention.

The integrated package preferably further includes an on-chip power supply.

According to a preferred embodiment of the present invention, a method of manufacturing a magnetic component includes providing a silicon wafer, and doping the silicon wafer to form doped regions that define an insulation that includes either an NPN-junction or a PNP junction. The silicon wafer includes a conductor, and the insulation completely surrounds at least a portion of the conductor.

Preferably, the conductor is a winding with at least two turns, and the insulation is an intra-winding insulation that is located between two adjacent turns of the at least two turns.

Preferably, the method further includes providing an additional conductor, and the insulation is an inter-conductor insulation located between the conductor and the additional conductor. Preferably, the conductor is a winding with at least two turns, and doping the silicon wafer includes forming doping regions between two adjacent turns of the at least two turns to form an intra-winding insulation that includes either an NPN-junction or a PNP junction.

Doping the silicon wafer preferably includes forming the conductor by doping a region more than the doped regions included in the insulation. The method preferably further includes forming the conductor by depositing conductive material within the substrate. Preferably, the method further includes forming a magnetic core by sputtering or sintering, and the conductor winds around the magnetic core.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

Figure 1:
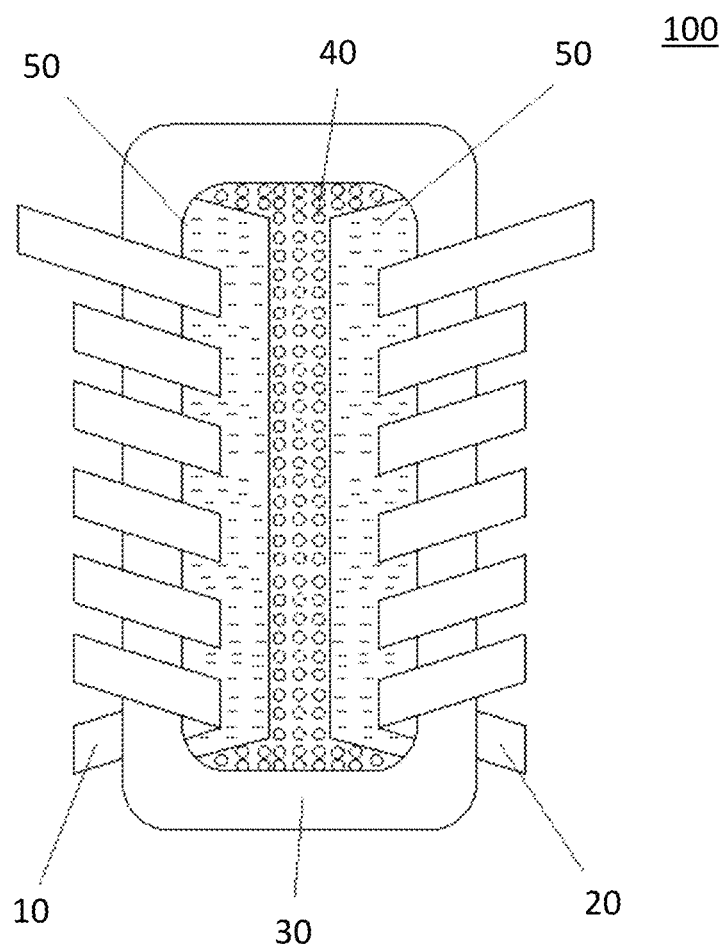
FIG. 1 shows a transformer with an NPN junction between two windings.
Figure 2:
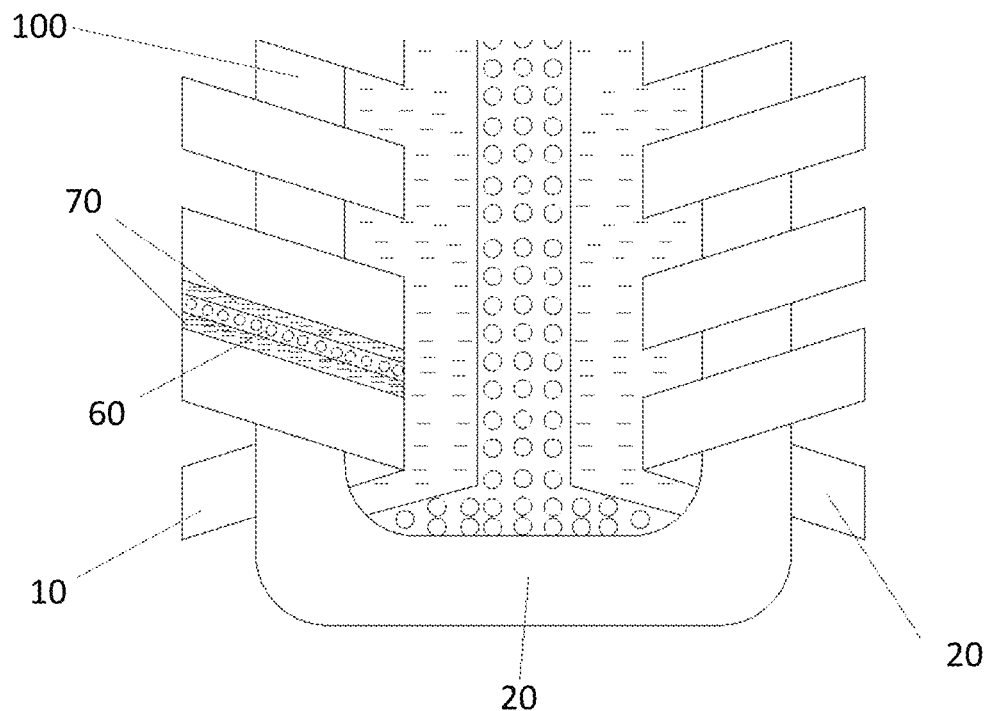
FIG. 2 shows a close-up view of a transformer with an NPN junction between two turns of a single winding.
Figure 4:
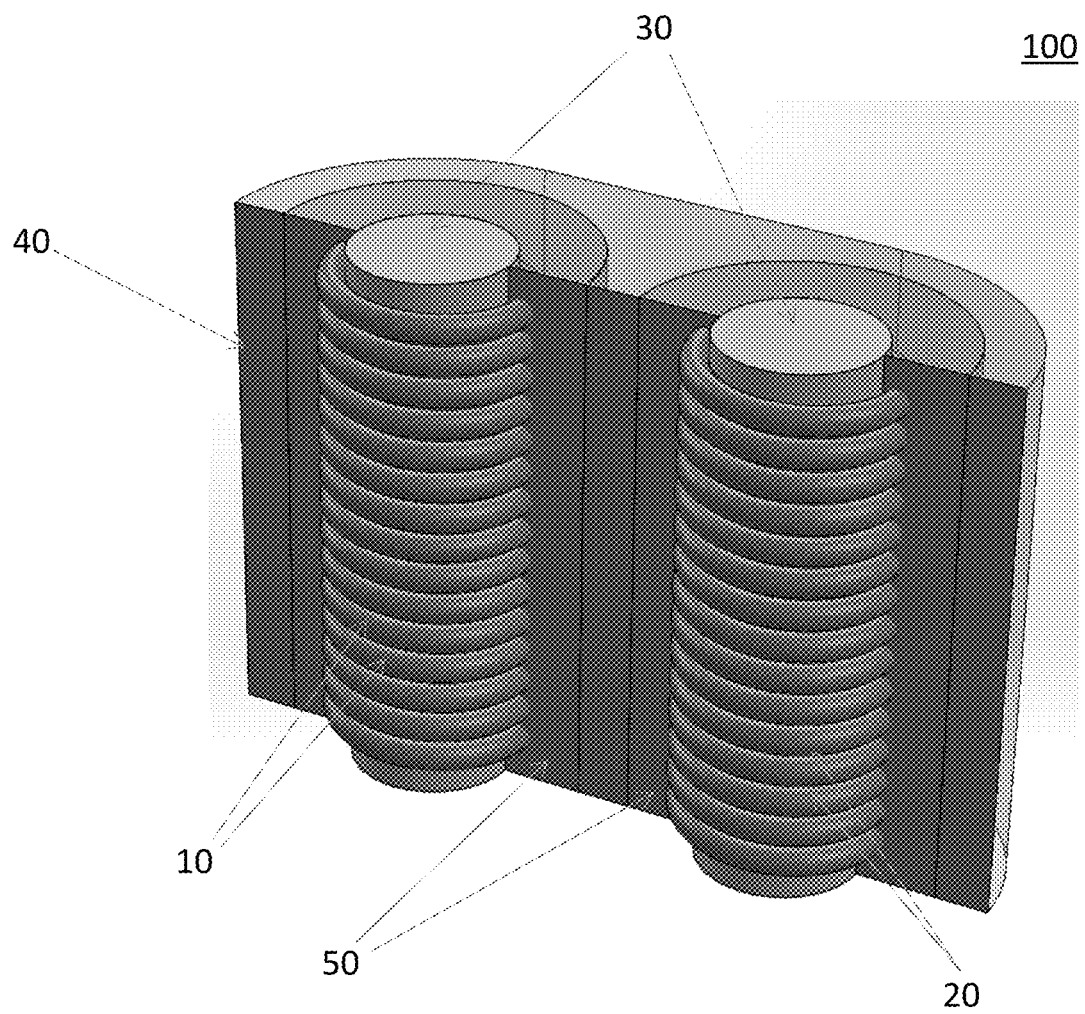
FIG. 4 is a sectional view of a transformer of a preferred embodiment of the present invention.

Insulation including two NP junctions, which will be referred to as NPN-junction insulation, is shown in FIGS. 1, 2, and 4. FIG. 1 shows a transformer 100 with inter-winding insulation between two windings 10, 20. FIG. 2 shows a transformer 100 with both inter-winding insulation between two windings 10, 20 and intra-winding insulation between the turns of one of the windings 10. For simplicity, in FIG. 2, intra-winding insulation is only shown between two adjacent turns in one of the windings 10. Intra-winding insulation can be used between every pair of adjacent turns in both windings 10, 20. FIG. 4 shows a transformer 100 with inter-winding insulation between two windings 10, 20. The transformers 100 in FIGS. 1 and 4 can also include intra-winding insulation between the turns of each of the windings 10, 20.

Inter-winding insulation includes the NPN-junction defined by a P-doped region 40 and an N-doped region 50, and intra-winding insulation includes the NPN-junction defined by a P-doped region 60 and an N-doped region 70. A P-doped region is a region of a semiconductor material that is doped with an acceptor material that provides holes with a positive charge, and an N-doped region is a region of a semiconductor material that is doped with a donor material that produces negatively charged electrons. A typical semiconductor material is silicon, but other semiconductor materials are also possible. Typical P-type dopants include boron, aluminum, gallium, and indium, but other hole producing dopants could also be used. And typical N-type dopants include phosphorus, arsenic, antimony, bismuth, and lithium, but other electron donating dopants could also be used. Although NPN-junction insulation is shown in FIGS. 1 and 2, it is also possible to use PNP-junction insulation with two PN junctions.

The spaces between the windings 10, 20 and between the turns of a single winding 10, 20 include N-doped region 50 and P-doped region 40 that define the NP or PN (NP/PN) junctions. Because the width of each doped region can be made very small, the resulting magnetic component can be extremely compact. The PNP/NPN-junction insulation does not need to be biased because reverse biasing only occurs when the voltage builds up between two current conductors, which is when the insulation is needed. Two PN or NP junctions ensure that the reverse biasing occurs even when the polarity of the voltages of current conductors switches.

As shown in the below calculations, the width of the depletion region is in the range of about 0.2 µm when forward biased. Although the width of the depletion region widens when reversed biased, the width of the depletion region is still in the range of several microns (e.g., 6.2 µm in the below calculation with a reversed biased voltage of 300 V).

$$\varepsilon_r := 11.68 \text{ Relative permeability of Silicon}$$

$$V_{bi} := 0.76 \ V \text{ Built up voltage}$$

$$V := 0.5 \ V \text{ Applied Bias}$$

$$N_A := 10^{20} \ cm^{-3} \text{ Number of ionized acceptors}$$

$$N_D := 10^{16} \ cm^{-3} \text{ Number of ionized donors}$$

$$q := 1.6 \cdot 10^{-19} \ C$$

$$\text{Width}_{DR} := \sqrt[2]{\frac{2 \cdot \varepsilon_r \cdot \varepsilon_0}{q} \cdot \left(\frac{N_A + N_D}{N_A \cdot N_D}\right) \cdot (V_{bi} - V)}$$

$$\text{Width}_{DR} = 0.183 \ \mu m$$

$$\varepsilon_r := 11.68 \text{ Relative permeability of Silicon}$$

-continued $V_{bi} := 0.76\ V$ Built up voltage $V := -300\ V$ Applied Bias $N_A := 10^{20}\ cm^{-3}$ Number of ionized acceptors $N_D := 10^{16}\ cm^{-3}$ Number of ionized donors $q := 1.6 \cdot 10^{-19}\ C$ $$\text{Width}_{DR} := \sqrt[2]{\frac{2 \cdot \varepsilon_r \cdot \varepsilon_0}{q} \cdot \left(\frac{N_A + N_D}{N_A \cdot N_D}\right) \cdot (V_{bi} - V)}$$

$\text{Width}_{DR} = 6.236\ \mu m$ where $\varepsilon_r$ is the relative permittivity of silicon, $\varepsilon_D$ is the permittivity of free space, $V_{bi}$ is the built-up voltage across a PN junction when it is forward biased, V is the voltage applied to bias the PN junction, $N_A$ is the concentration of dopant acceptors added to a semiconductor to form the p-type region, $N_D$ is the concentration of dopant donors added to a semiconductor to form the n-type region, q is the charge of an electron, and $\text{Width}_{DR}$ is the width of the depletion region.

Using such thin insulation allows the magnetic components to be made smaller. Both the inter-winding distance between windings and the intra-winding distance between adjacent turns can be made smaller, resulting in a more compact and reliable magnetic component.

Figure 3:
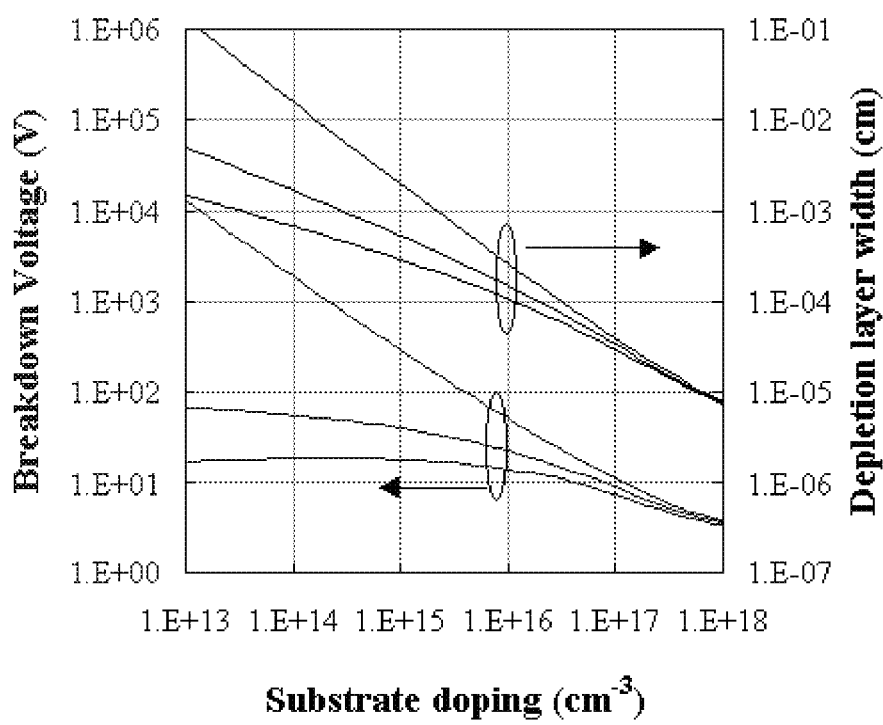
FIG. 3 shows the breakdown voltage and depletion-layer width as a function of doping concentration.

FIG. 3 shows that the width of the depletion layer shrinks with increasing doping density. Thus, as doping density increases, the magnetic components can be made smaller.

A magnetic component with PNP/NPN-junction insulation can be made using the following steps:
1. provide a silicon wafer;
2. demarcate the P-type and N-type doped regions;
3. dope the silicon wafer to form the P- and N-type doped regions;
4. form the magnetic core, if the magnetic component includes a magnetic core, using sputtering, sintering, or other suitable process depending on the type of magnetic material used;
5. deposit the conductive material using a process such as electroplating to create current conductors. Alternatively, very high doping can be used to create current paths, which could be done in step 3 or could be done separately. Very high doping is a doping concentration with a large acceptor or donor density that is close to the electron density of a conductor, i.e., the number of acceptors or donors is greater than $10^{20}/cm^3$.;
6. cover the magnetic component with a silicon wafer that is pre-doped with N- and/or P-type doped regions; and
7. package or integrate the magnetic component with an on-chip power supply.

In PCB integrated magnetics, instead of using an insulating material such as FRP or other similar insulation material, a silicon layer doped to form PNP/NPN-junction insulation can be used. This will provide a much higher dielectric strength than FRP or other similar insulation material. PCB integrated magnetics are relatively larger than the magnetics embedded in the silicon discussed in step 7 above.

The intra-winding insulation shown in the FIG. 2 can be used in high-voltage applications that use high-voltage inductors or transformers. In high-voltage applications, there can be a very high voltage between the turns of an inductor or a transformer. PNP/NPN-junction insulation can be used as the intra-winding insulation to reliably maintain high dielectric strength between the turns of the inductor or transformer.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A magnetic component comprising:
   a semiconductor substrate;
   a first winding that is located in the semiconductor substrate and that includes at least two turns; and
   intra-winding insulation located between two adjacent turns of the at least two turns and including doped regions in the semiconductor substrate that define either an NPN-junction or a PNP junction.

2. The magnetic component of claim 1, wherein the first winding includes a doped region in the semiconductor substrate that is doped more than the doped regions included in the intra-winding insulation.

3. The magnetic component of claim 1, wherein the first winding includes a conductive material.

4. The magnetic component of claim 1, further comprising a magnetic core; wherein
   the first winding winds around the magnetic core.

5. An integrated package including the magnetic component of claim 1.

6. The integrated package of claim 5, further comprising an on-chip power supply.

7. A magnetic component comprising:
   a semiconductor substrate;
   first and second conductors that are located in the semiconductor substrate; and
   inter-conductor insulation located between the first and second conductors and including doped regions in the semiconductor substrate that define either an NPN-junction or a PNP junction.

8. The magnetic component of claim 7, wherein
   the first conductor is a winding that includes at least two turns; and
   intra-winding insulation is located between two adjacent turns of the at least two turns and includes doped regions in the semiconductor substrate that define either an NPN-junction or a PNP junction.

9. The magnetic component of claim 7, wherein each of the first and second conductors includes a doped region in the semiconductor substrate that is doped more than the doped regions included in the inter-conductor insulation.

10. The magnetic component of claim 7, wherein each of the first and second conductors includes a conductive material.

11. The magnetic component of claim 7, further comprising a magnetic core; wherein
    the first and second conductors wind around the magnetic core to define a transformer.

12. An integrated package including the magnetic component of claim 7.

13. The integrated package of claim 12, further comprising an on-chip power supply.

* * * * *